United States Patent
Nagata et al.

(10) Patent No.: US 6,873,001 B1
(45) Date of Patent: Mar. 29, 2005

(54) REDUCED SIZE PLATE LAYER IMPROVES MISALIGNMENTS FOR CUB DRAM

(76) Inventors: Toshiyuki Nagata, Plano, TX (US); Hiroyuki Yoshida, Plano, TX (US); Masayuki Moroi, Richardson, TX (US); Atsushi Satoh, Dallas, TX (US)

(*) Notice: Subject to any disclaimer, the term of this patent is extended or adjusted under 35 U.S.C. 154(b) by 642 days.

(21) Appl. No.: 09/332,360

(22) Filed: Jun. 10, 1999

Related U.S. Application Data (60) Provisional application No. 60/090,837, filed on Jun. 26, 1998.

(51) Int. Cl.[7] ................. H01L 27/108; H01L 29/76; H01L 29/94; H01L 31/119

(52) U.S. Cl. ........................... 257/306; 257/296

(58) Field of Search .................. 257/295–310, 257/532–535, 906–908; 438/253–254, 396–399

(56) References Cited

U.S. PATENT DOCUMENTS 6,020,235 A * 2/2000 Chang ................. 438/253

* cited by examiner

*Primary Examiner*—Cuong Nguyen (57) ABSTRACT

In a DRAM array using a capacitor-under-bitline (CUB) layout, the plate layer of the capacitor is significantly reduced in area to reduce misalignments in connections between the bitline and the underlying transistors.

1 Claim, 14 Drawing Sheets

REDUCED SIZE PLATE LAYER IMPROVES MISALIGNMENTS FOR CUB DRAM

This application claims priority under 35 USC § 119(e)(1) of provisional application No. 60/090,837 filed Jun. 26, 1998.

BACKGROUND AND SUMMARY OF THE INVENTION

Figure 10:
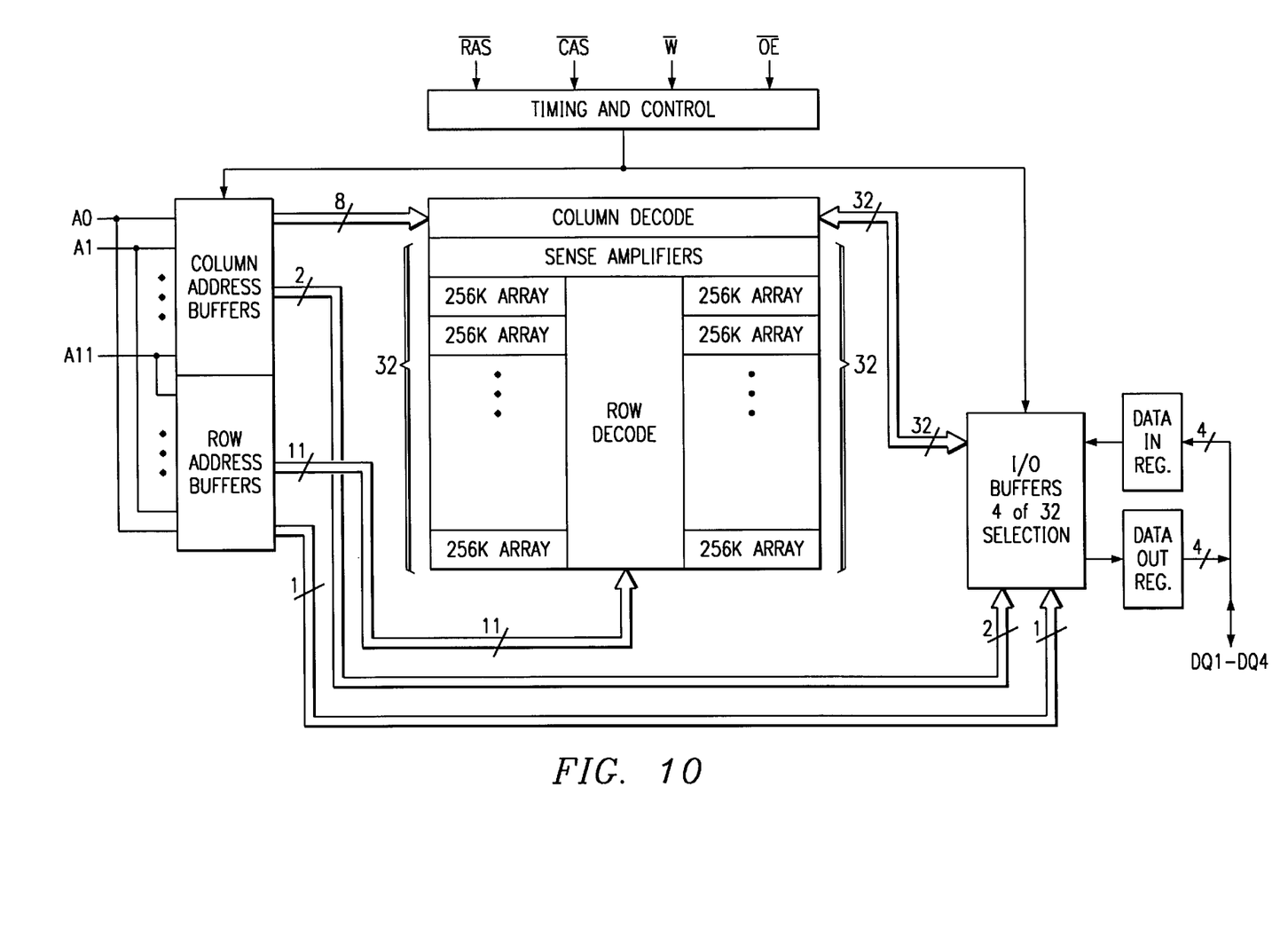
FIG. 10 is a block diagram of a DRAM memory.

The present invention relates to integrated circuit structures and fabrication methods, especially to layout design for DRAM cells. A block diagram of a DRAM memory is shown in FIG. 10.

Background: Layout for Pit-Type DRAM Cell

There are two types of stacked cells in DRAM: the Capacitor Over Bitline (COB) cell and the Capacitor Under Bitline (CUB). The bitline for the CUB cell can be merged with the metal-1 line, which reduces process cost and makes this design attractive for certain applications. However, as sizes shrink and integration increases, e.g. for 1-giga-byte or 4-giga-byte memory, misalignment between various layers, such as the plate layer and the bitline contact, becomes a much larger problem, as will be shown.

Figure 4:
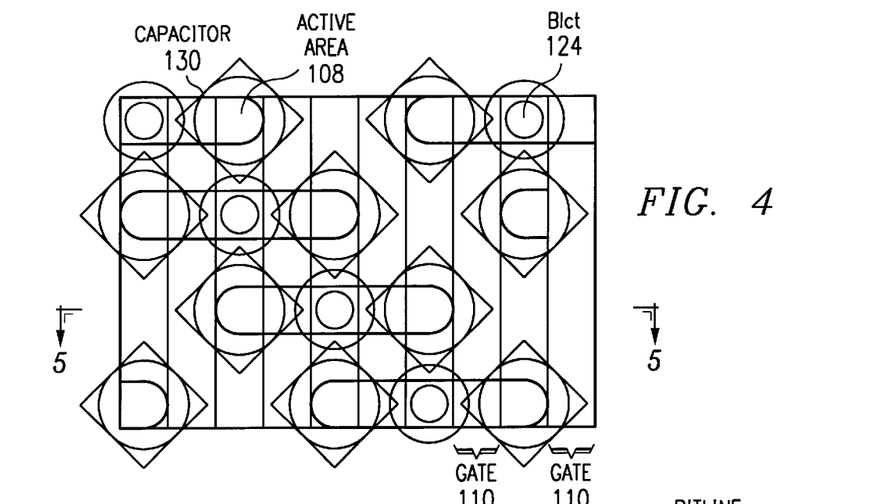
FIG. 4 shows a layout for CUB cells.

FIG. 4 shows the layout of one type of CUB array, this one composed of pit-type capacitors. In the orientation shown in this figure, silicon active areas 108 form elongated ovals separated by dielectric isolation, while gate lines 110 run vertically. Bit-line contacts 124 (BLCTs) are arranged in a diagonal pattern on the active areas, with each BLCT having capacitors 130 on either side.

Figure 5:
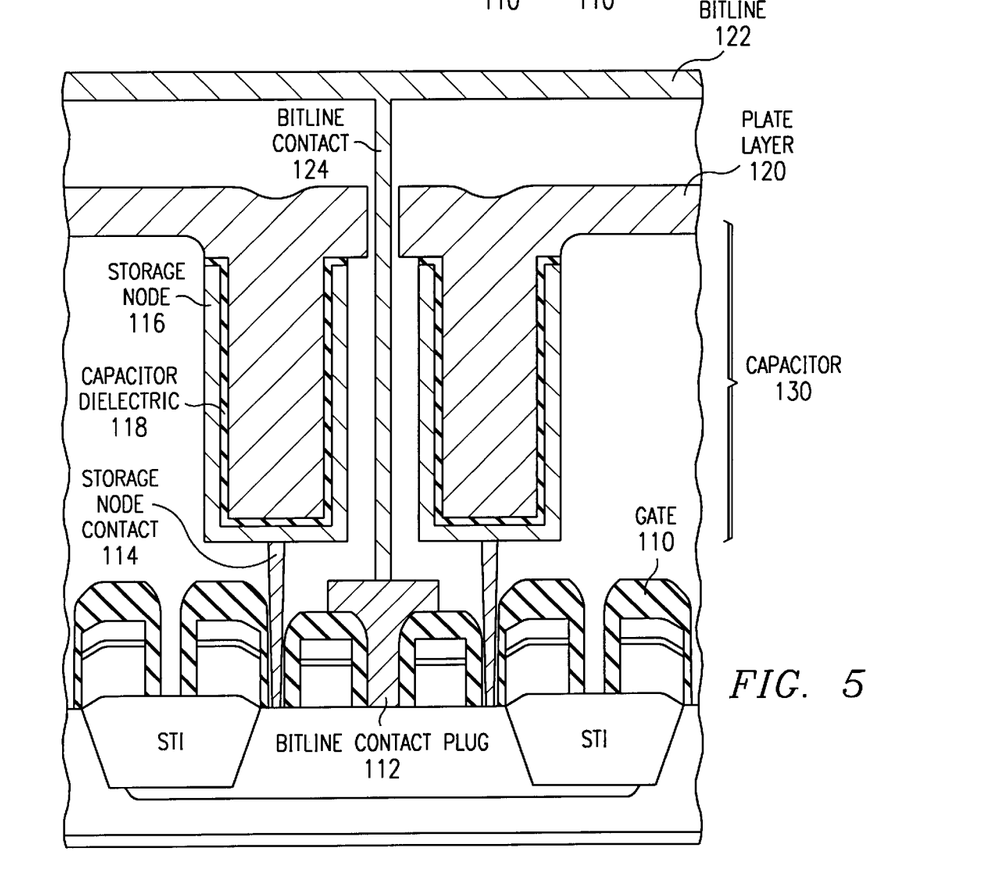
FIG. 5 shows a cross-section for a previously used DRAM cell.

A cross section along line a–a' of FIG. 4 reveals a structure like that shown in FIG. 5. In this figure, capacitors 130 are shown overlying gates 110. The capacitors are composed of three layers: a conductive storage node 116, which contacts the underlying wafer through the storage node contact 114, the conductive plate layer 120, which also extends horizontally between capacitors, and capacitor dielectric 118 to separate the conductive layers. The bitline 122 is above the capacitors, while the bitline contact 124 descends through the level of the capacitors to contact the active area at the bitline contact plug 112.

Figure 6:
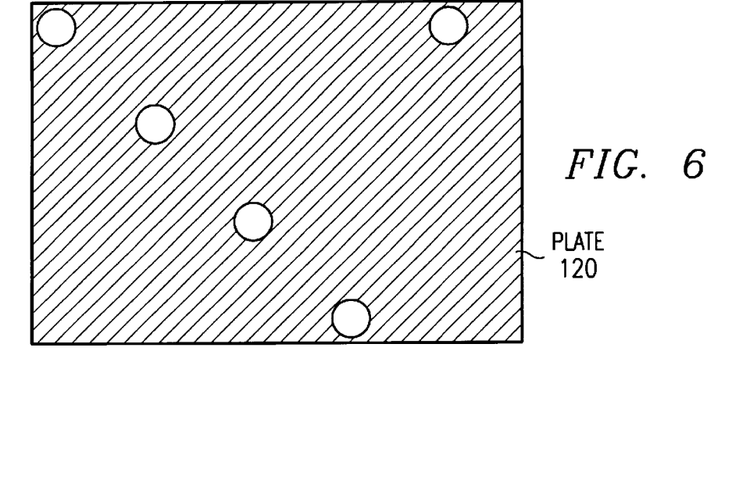
FIG. 6 shows a prior art pattern for the plate level.

FIG. 6 shows the pattern used on the plate layer 120. As this pattern is compared to the layout shown in FIG. 4, it can be noted that the plate will cover the entire area of the array, except directly around those points where the bit line contacts will be made.

Figure 8:
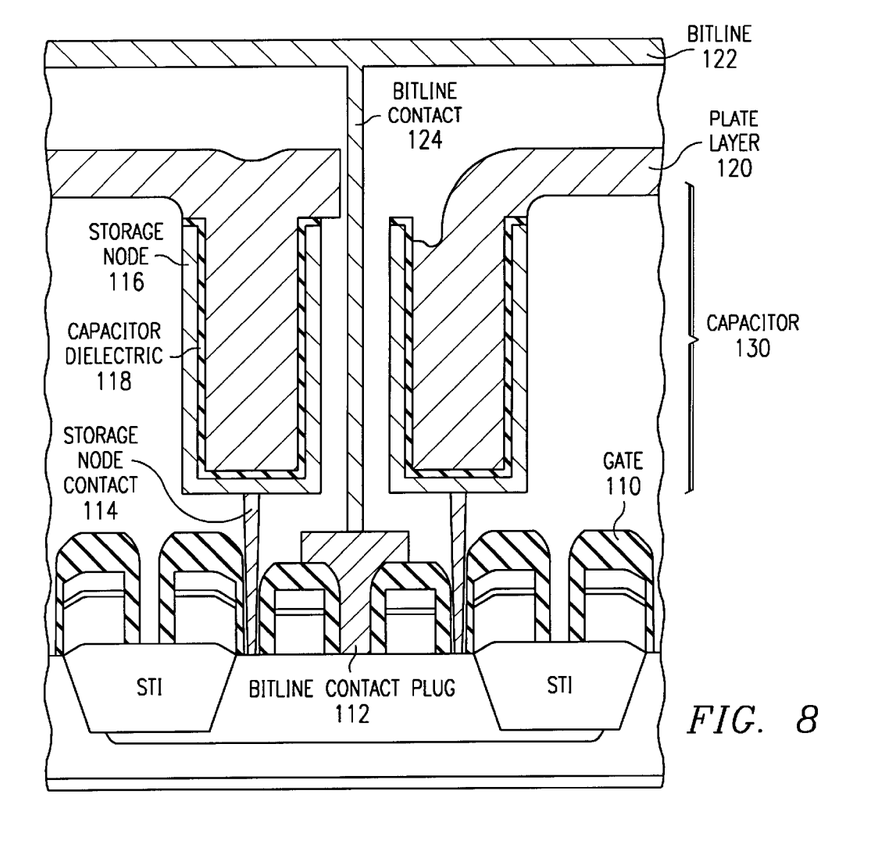
FIG. 8 shows the cross-section of FIG. 5 when a misalignment has occurred.

One problem with any layout is the possibility of misalignments between structures. This is illustrated in FIG. 8, which shows the cell of FIG. 5 when a misalignment occurs between the plate and the storage node (see the areas circled). Errors such as this result from the fact that as various layers are patterned, the stepper is aligned to marks which are created for this purpose. These alignment marks become obscured as processing continues, requiring new alignment marks to be formed, with attendant possibilities for errors.

Figure 7A:
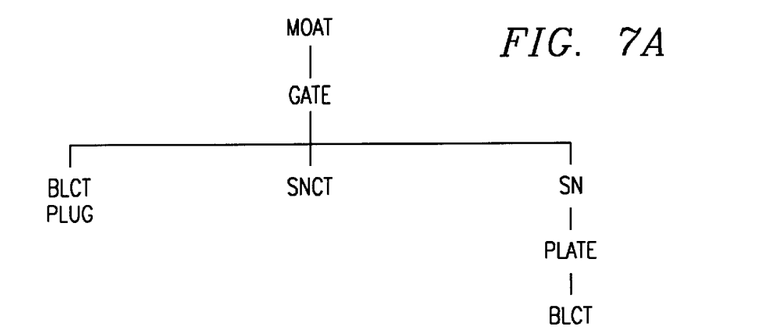
FIGS. 7A and B show alignment trees for previous and current layout schemes respectively.

The alignment tree shown in FIG. 7A illustrates the alignment dependencies for this design. In this tree, patterning for the bitline contact (BLCT) plug, the storage node contact (SNCT), and the storage node (SN) are all aligned to marks in the gate layer. Formation of the storage nodes will make it impossible to align further features to the gate level, so the plate level is aligned to marks on the storage node level, while the bitline contact must be aligned to marks on the plate level. As seen in the alignment tree, the further various features are from each other on the alignment tree, the larger can be the potential magnitude of a misalignment between them. For example, in FIG. 7A, there are four layers of possible alignment error between the BLCT and the BLCT plug (BLCT to plate, plate to storage node, storage node to gate, gate to BLCT plug). If a typical 1-layer alignment margin averages 0.052 microns, then statistically a two-layer misalignment will average 0.072, a three-layer misalignment will average 0.88, and a four-layer misalignment will average 0.101 microns. Thus it is very desirable to minimize the alignment relationship between parts of the structure.

Reduced Size Plate Layer

Figure 1A:
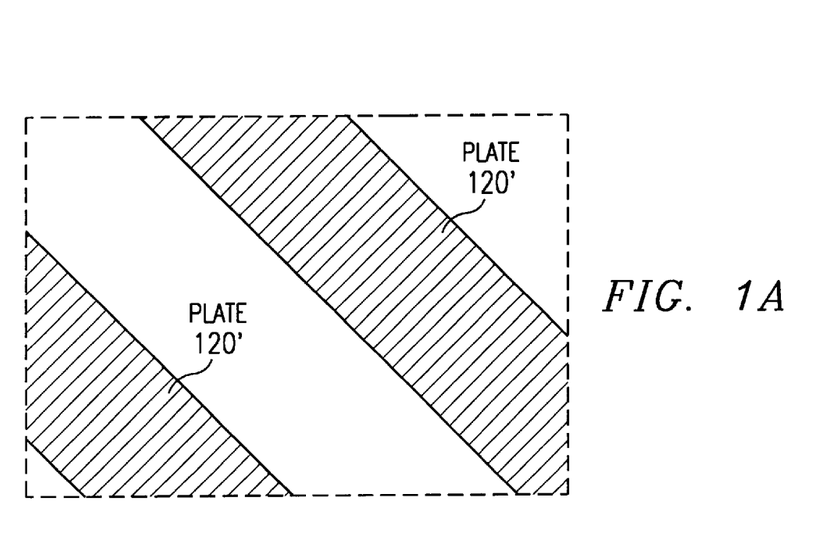
Figure 7B:
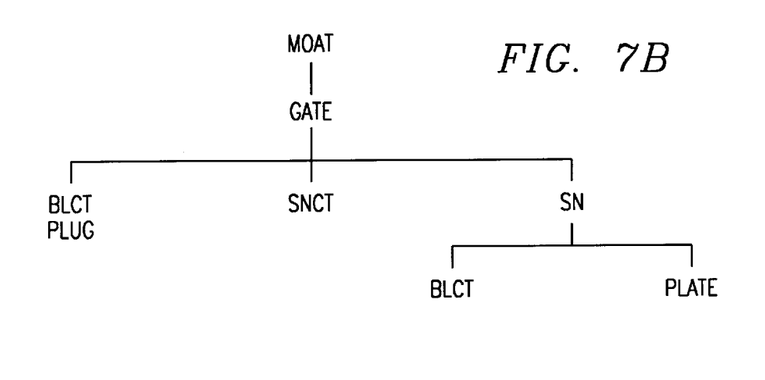

The present application discloses patterning the plate layer to reduce its size and simplify alignment. An important concept underlying the present invention is that, in pit-type DRAM cells, the vertically extended capacitor means that most of the capacitor area is inside the cavity of the storage node. Thus, the contribution to total capacitance by the plate electrode on the field is relatively small. This understanding can be exploited to simplify the alignment relations in pit-type DRAM cells, and hence provide more compact cells and/or higher yield during manufacturing. The plate electrode, according to the preferred embodiment, is not substantially continuous in two orthogonal directions: instead the plate electrode, where it overlies the array or subarray, runs across the array as a series of parallel strips. The bitline contacts fall between the strips, but the alignment of the plate mask is not a critical dimension. Rather than the solid plate with holes shown in FIG. 6, the disclosed process patterns the plate layer as shown in FIG. 1A, in diagonal strips which cover approximately half of each storage node, while the adjacent open area on this level overlies the bitline contact plugs, leaving ample room for the bitline contact to descend, even in the worst misalignment scenario. As seen in the alignment tree of FIG. 7B, the plate layer is no longer in the critical path between the storage node and the bitline contact, reducing the possibility of misalignments. In this example, the greatest misalignment possible is three levels, between the BLCT and the BLCT plug (bitline contact to storage node, storage node to gate, gate to bitline contact plug).

Advantages of the disclosed methods and structures include less risk of misalignments which can cause a defective chip.

BRIEF DESCRIPTION OF THE DRAWINGS

The disclosed inventions will be described with reference to the accompanying drawings, which show important sample embodiments of the invention and which are incorporated in the specification hereof by reference, wherein:

FIGS. 1A and B each show one possible pattern for the plate level while

FIGS. 2A–F show an overview of the array during various stages of the processing, while

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Primary Embodiment

Figure 9:
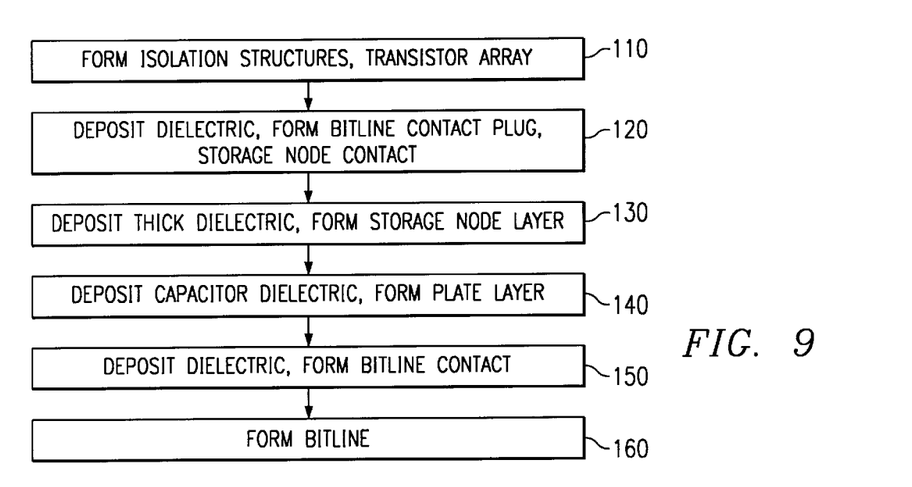
FIG. 9 is a flow chart showing key steps in fabricating a DRAM array.

Formation of the disclosed CUB DRAM cells will now be discussed with reference to the flowchart of FIG. 9, which will be discussed in connection with FIGS. 2A–F and 3A–H, which show overviews and cross-sections respectively of the DRAM array during stages of processing.

Figures 2A, 2B:
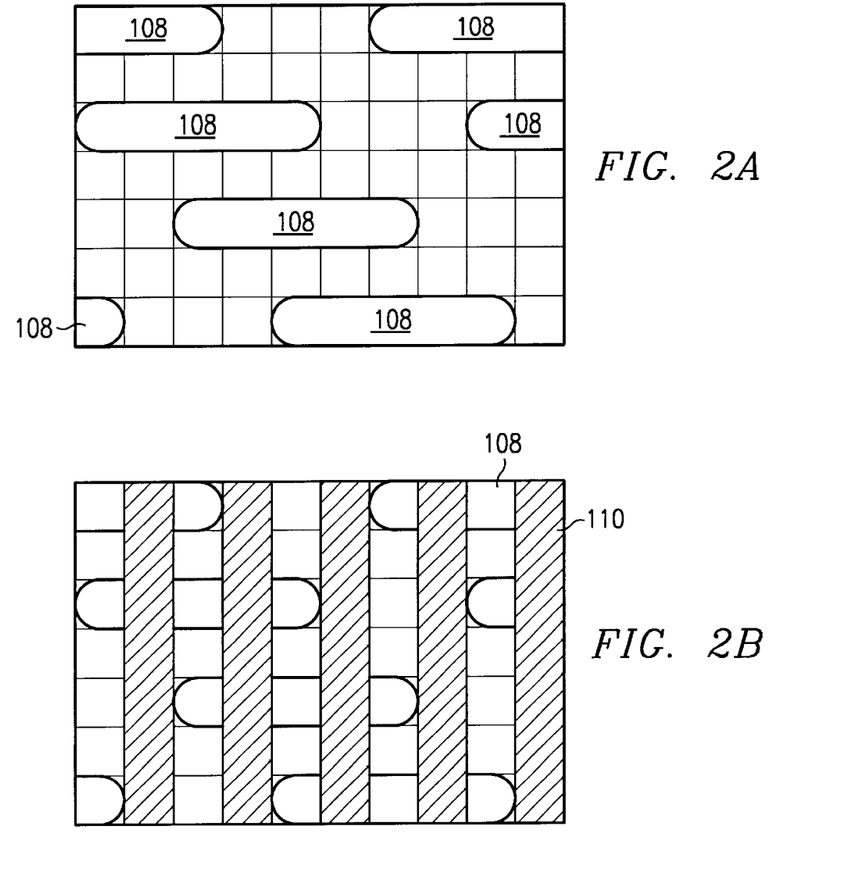
Figure 3A:
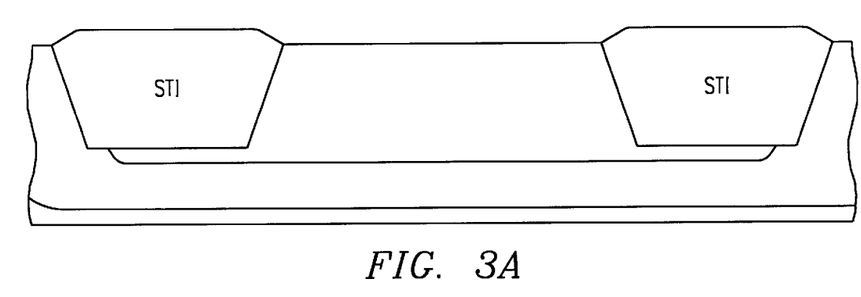
FIGS. 3A–H show the corresponding cross-sections of the cell.
Figure 3B:
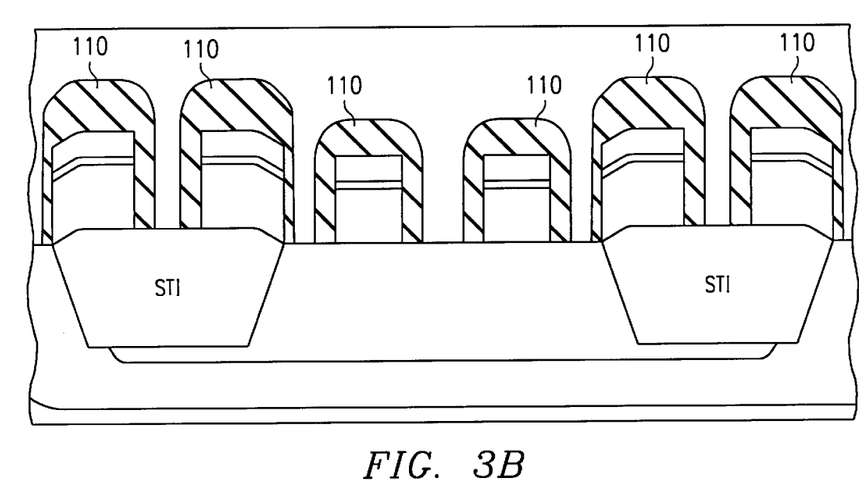

Isolation structures are first formed on the wafer substrate, such as the shallow trench isolation shown in FIG. 3A, leaving the soon-to-be active areas 108 exposed. FIG. 2A shows an "overhead" view of the wafer, showing the pattern of active areas, with a grid pattern shown merely for convenience. Transistors are formed, including gate structures 110. The gate stack preferably (but not necessarily) comprises polysilicon, TiN, and tungsten. FIG. 3B and FIG. 2B show the array once the transistors are completed (step 110).

Figure 2C:
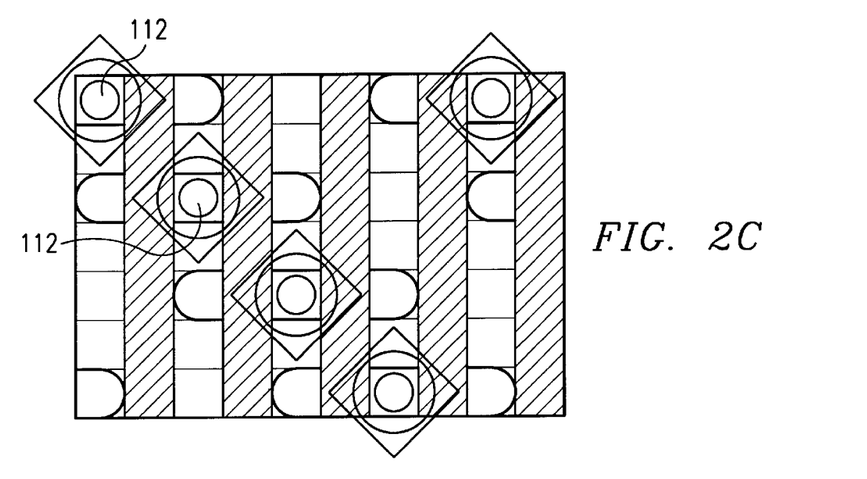
Figure 2D:
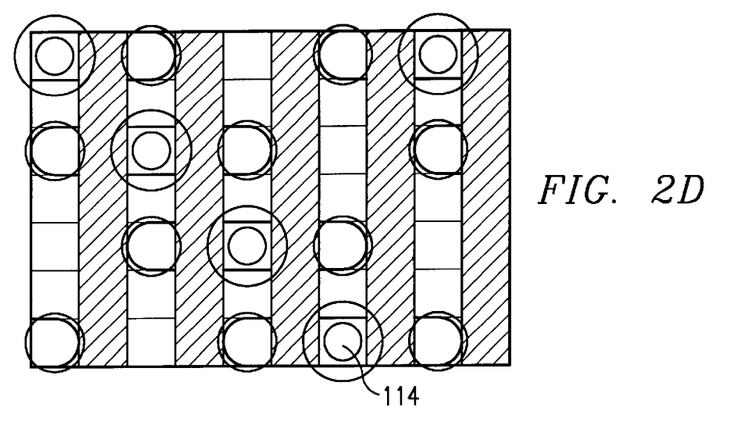
Figure 3C:
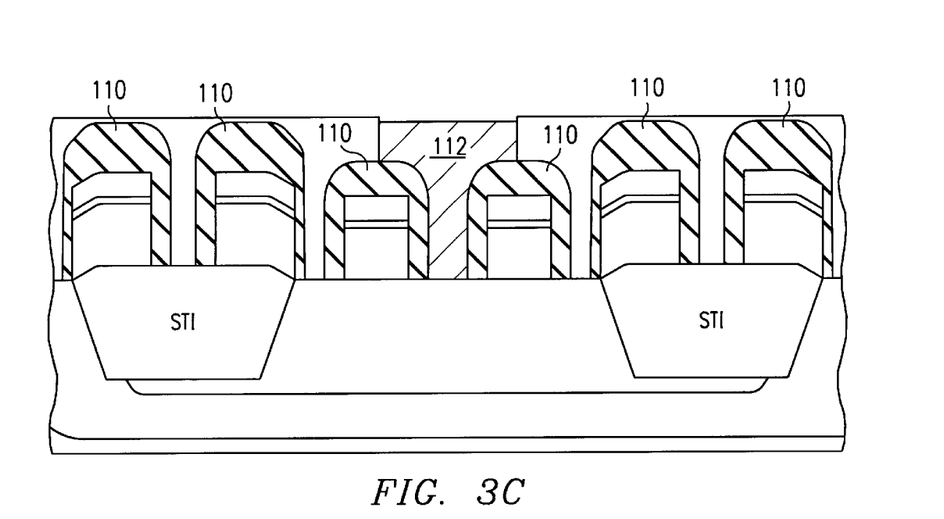
Figure 3D:
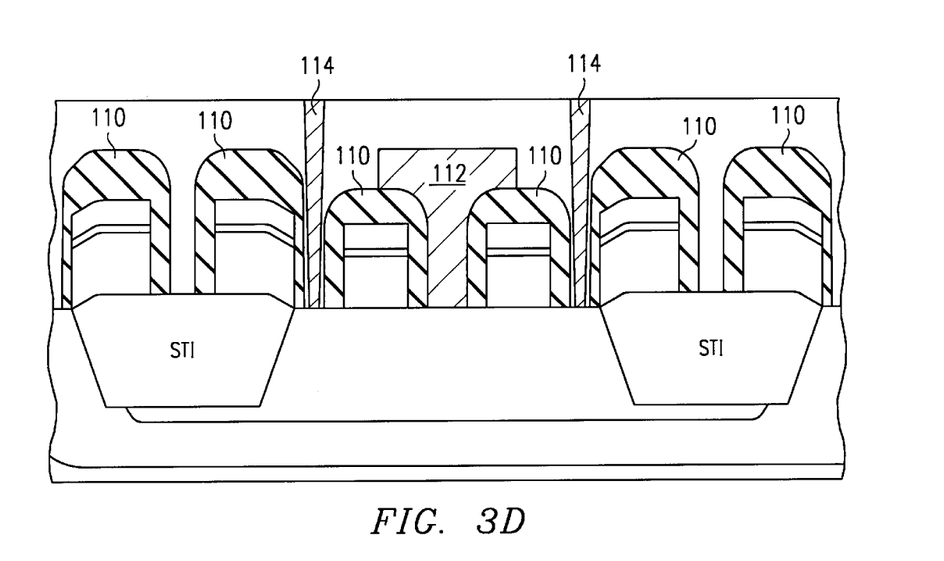

A layer of dielectric is deposited, e.g. 5 nm of SiO2. As seen in FIG. 3C and FIG. 2C, a contact is etched between selected gates, and filled with polysilicon to form a plug 112 to receive the bitline contact, which will be formed later. FIG. 3D and FIG. 2D illustrate the addition of a further layer of dielectric, e.g. 200 nm of SiO2, and the formation of polysilicon contacts 114 for the storage nodes (step 120).

Figure 2E:
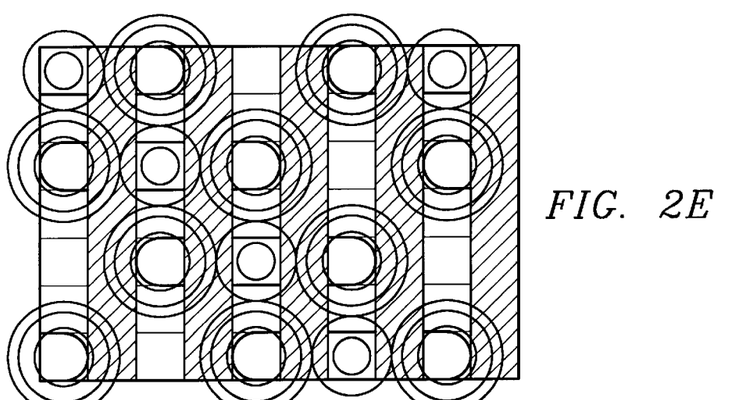
Figure 3E:
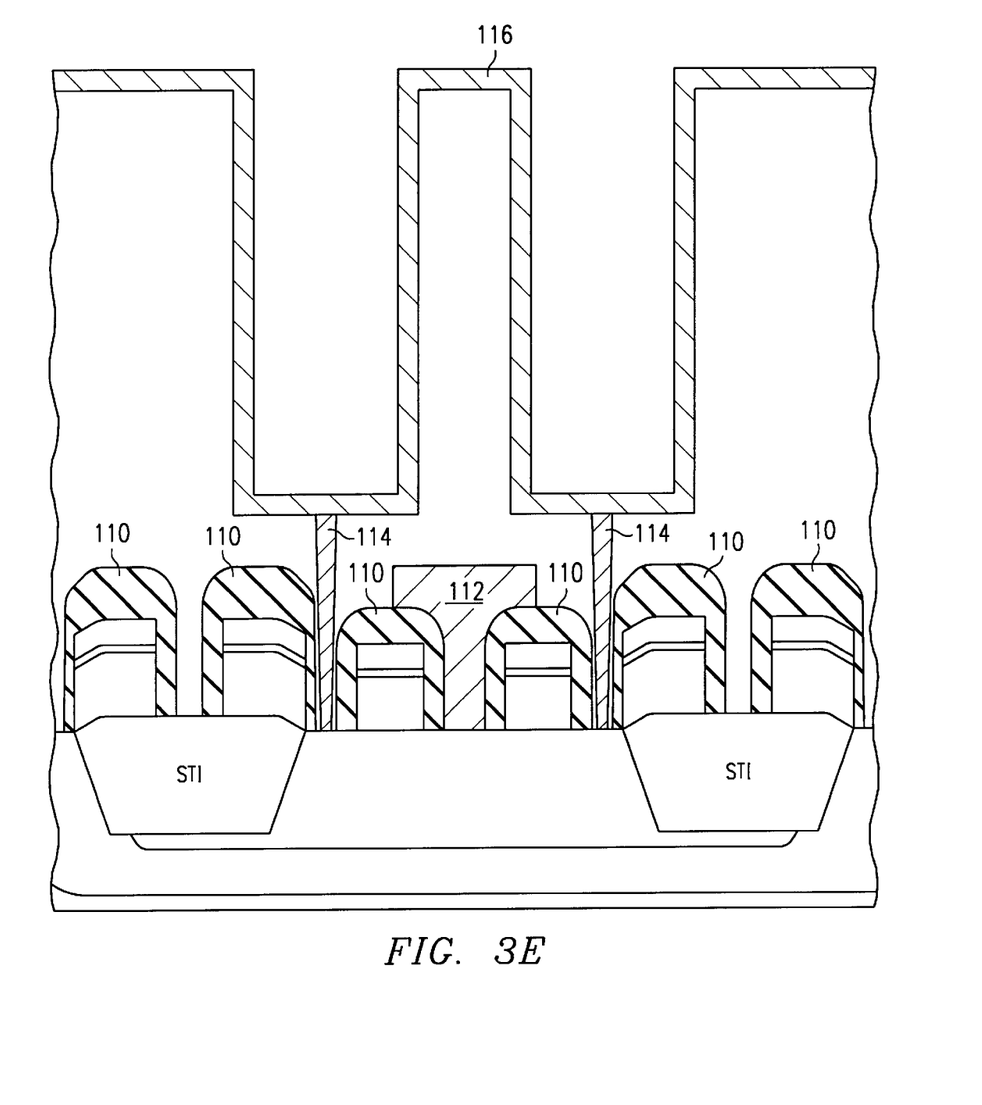

A further deposition of dielectric, e.g. 1 micron of SiO2, provides a volume in which capacitors can be formed. As seen in FIG. 3E and FIG. 2E, cylindrical holes are etched in the dielectric, then a conformal layer of polysilicon is deposited to form the storage node layer 116 of the capacitors. Chemical-mechanical polishing is then performed on the wafer to remove the polysilicon from the upper surface of the dielectric, followed by a non-isotropic dry etch to remove the polysilicon in the top portion of the storage node (step 130).

Figure 2F:
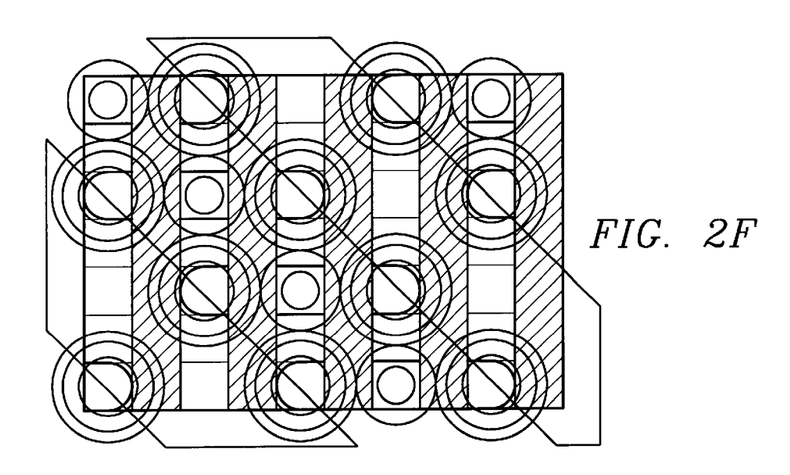
Figure 3F:
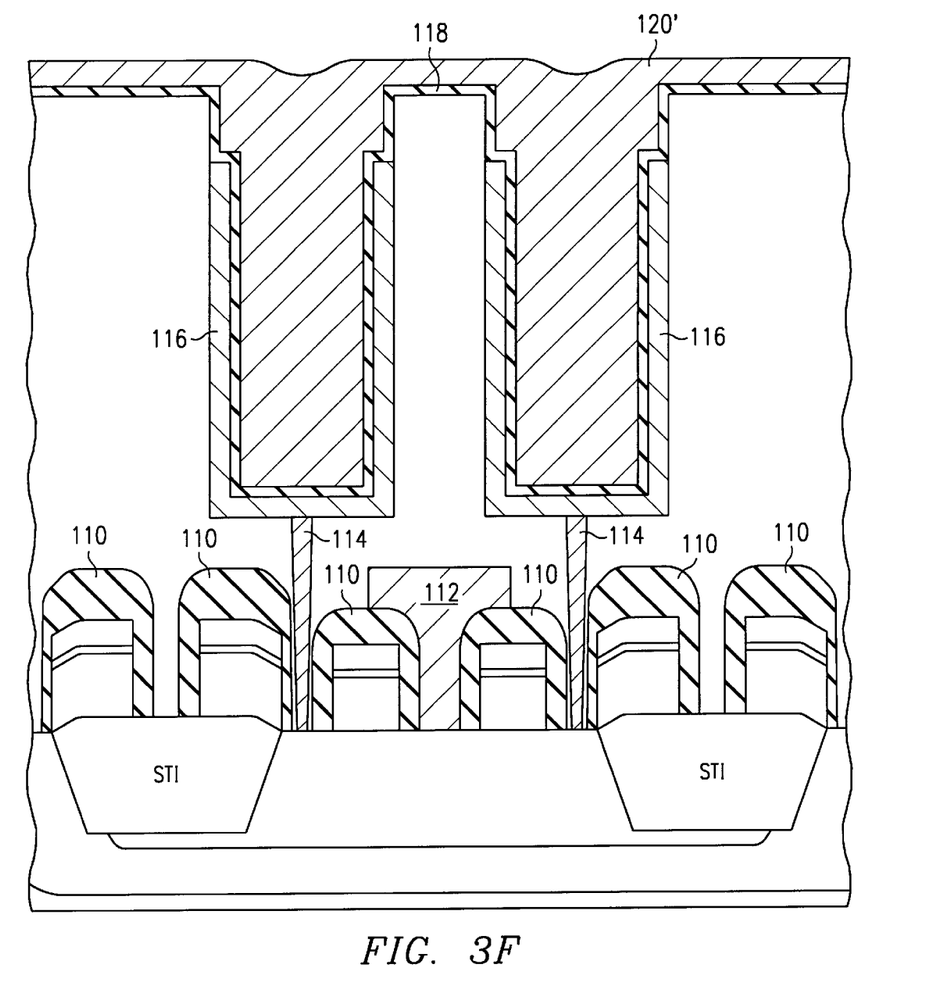
Figure 3G:
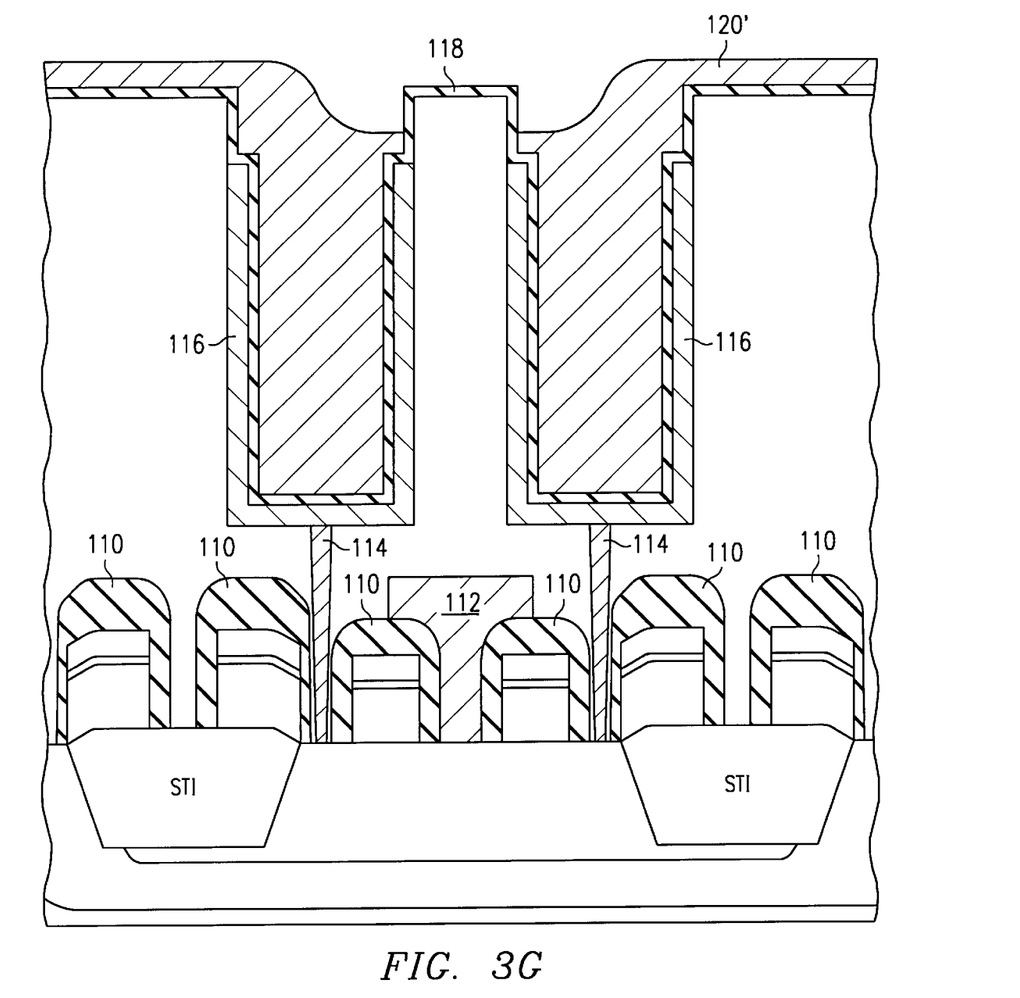

As shown in FIGS. 3F, a thin dielectric layer 118, e.g. 10 nm of Ta2O5, is deposited, followed by deposition of the plate layer 120, e.g. 100 nm of TiN. The TiN fills remaining portions of the cylindrical hole, and extends from the top of the capacitor. to connect the various capacitors. In this embodiment, the plate layer is patterned and etched to leave the plate only in strips which cross the grid pattern on a diagonal. FIG. 2F shows the relationship of the plate layer to the layout of the rest of the array. Although not seen in the figures, the strips of the plate layer are preferably (but not necessarily) joined at the edges of the array or sub-array. FIG. 3G shows the cross-section of the cell after the plate layer has been etched (step 140).

Figure 3H:
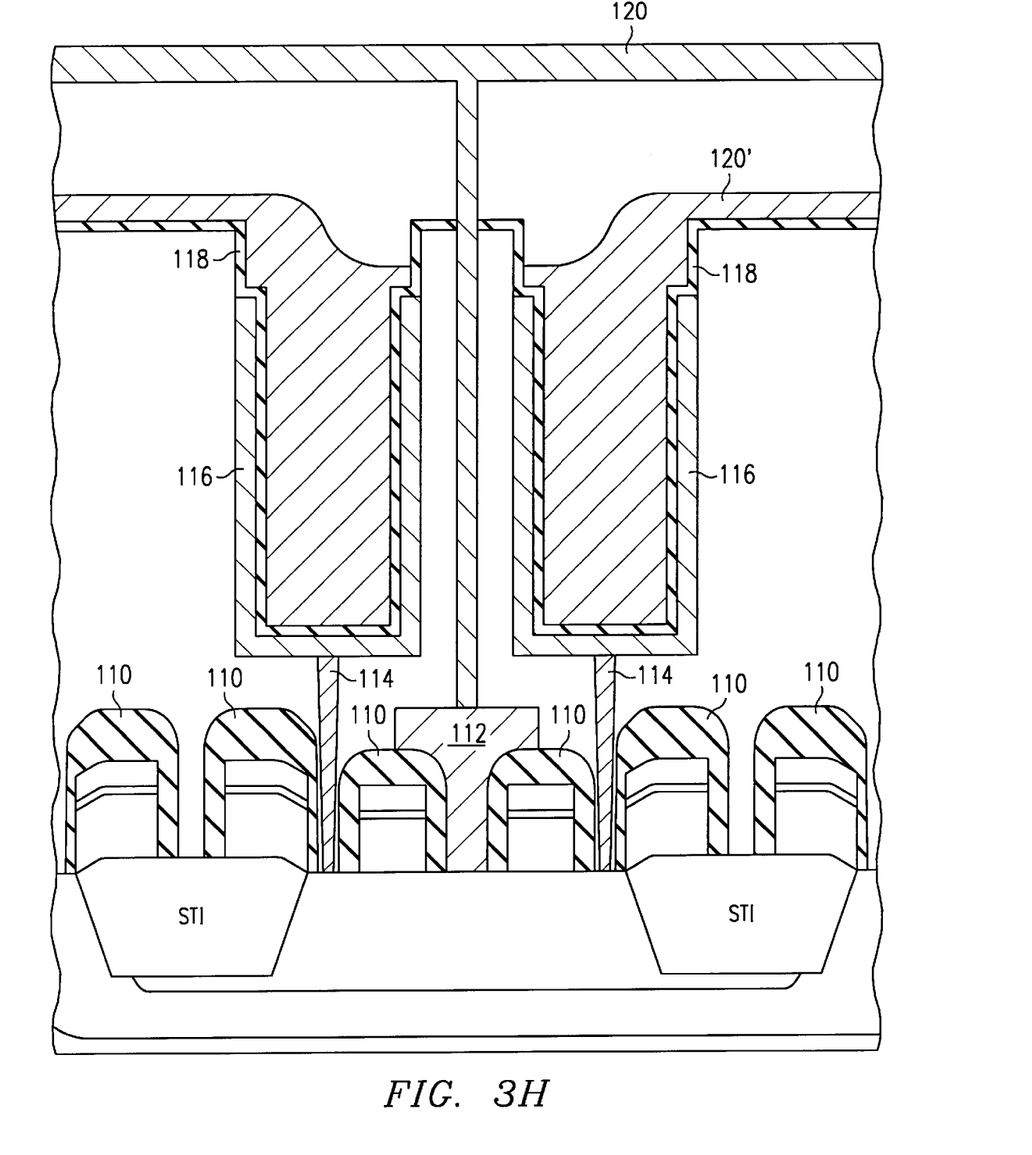

Following completion of the storage node, a further layer (e.g. 100 nm) of SiO2 is deposited, a mask is formed, and contact 124 is etched to the bitline contact plug 112 previously created (step 150). FIG. 3H shows the cell after formation (step 160) of the bitline 122.

Alternate Embodiment: Shape of Plate Layer

Figure 1B:
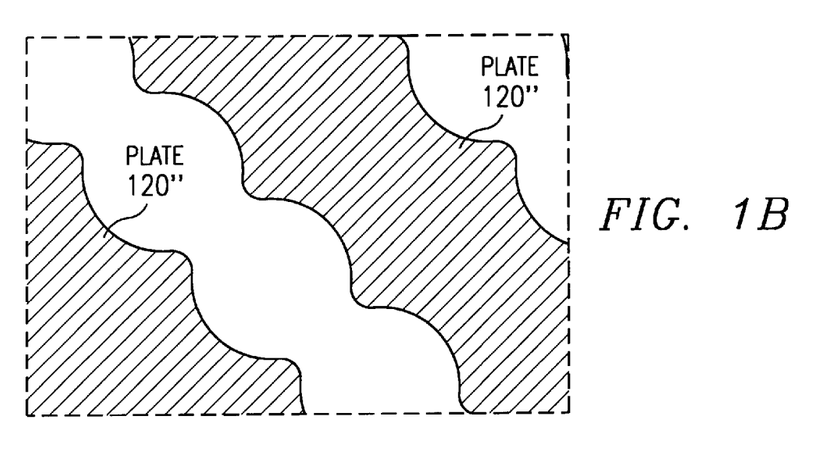
Figure 1C:
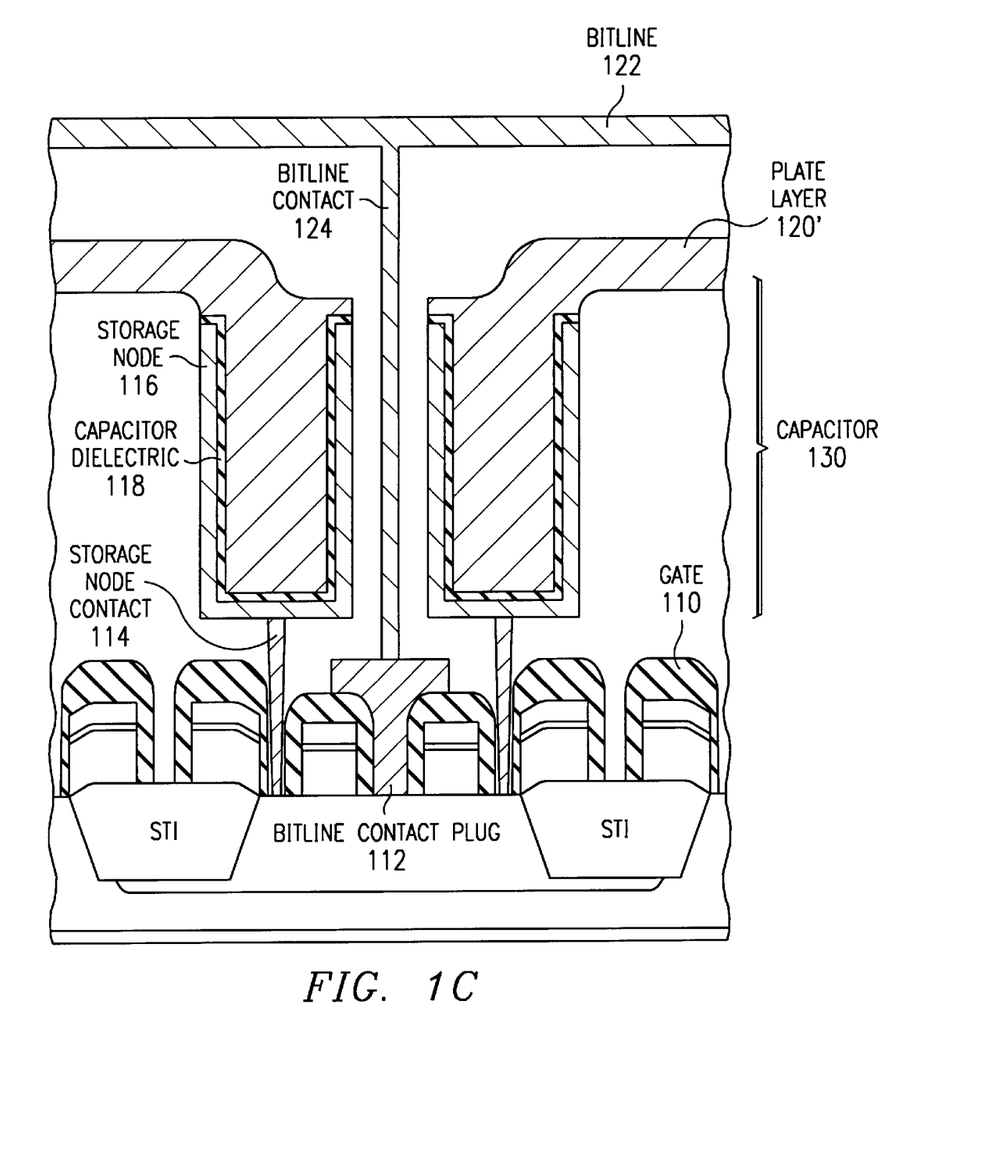
FIG. 1C shows a cross-section of an array formed using the disclosed plate pattern for the primary embodiment of FIG. 1A.

In an alternate embodiment, the plate layer can be patterned to have a different design, which can cover either more or less of the area of the array. One possible variation is shown in FIG. 1B. In regard to the pattern of the plate layer, the defining characteristic is that this layer not be in the critical pathway of the alignment tree.

Alternate Embodiment: SiOxNy as Capacitor Dielectric

In a further alternate embodiment, capacitor dielectric 118 can be formed of a thin layer of SiOxNy. Other parameters remain the same.

Alternate Embodiment: Polysilicon for Plate Layer

In a further alternate embodiment, the plate layer is formed of polysilicon rather than TiN. Other parameters remain the same.

Alternate Embodiment: Metal for Plate Layer

In a further alternate embodiment, the plate layer can be of any suitable metal, such as tungsten. Other parameters remain the same.

According to a disclosed class of innovative embodiments, there is provided: A random access memory, comprising: an array of capacitors, ones of said capacitors being electrically coupled by a conductive plate which overlies said array of capacitors; wherein the pattern of said conductive plate is continuous in at most one dimension, but not in two dimensions.

According to another disclosed class of innovative embodiments, there is provided: A random access memory, comprising: a bitline overlying a plurality of transistors and having connections therebetween; a plurality of capacitors in a vertical relationship between said bitline and said plurality of transistors, ones of said capacitors being electrically coupled by a conductive plate, wherein said conductive plate is patterned such that said conductive plate does not affect alignment relationships in said connections between said bitline and said transistors.

According to another disclosed class of innovative embodiments, there is provided: A method of forming an array of capacitors in a capacitor-under-bitline configuration, comprising the step of forming a conductive plate layer over a partially fabricated array of capacitors; wherein said plate layer is not a critical alignment factor, and wherein further components of said capacitor array are not aligned to said plate layer.

According to another disclosed class of innovative embodiments, there is provided: A method for fabricating a pit-type DRAM memory cell array, comprising the actions of: forming a plurality of transistor gates; forming a plurality of pit-type capacitors which are aligned to said gates; forming a plurality of bit line contacts which are aligned to said capacitors; wherein a plate layer is also connected to one node of said capacitors, but alignment of said bit line contact does not depend on the alignment of said plate layer.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, the etch in step 130 does not have to be totally non-isotropic, but can have a slight isotrophy, so that it removes some polysilicon from the inner walls.

What is claimed is:

1. A random access memory, comprising:

a bitline overlying a plurality of transistors and having connections therebetween;

a plurality of capacitors in a vertical relationship between said bitline and said plurality of transistors, ones of said capacitors being electrically coupled by a conductive plate, wherein said conductive plate is patterned such that said conductive plate does not affect alignment relationships in said connections between said bitline and said transistors and said conductive plate is patterned in strips which are diagonal to gate structures of said plurality of transistors.

* * * * *